(12) United States Patent
Kayahara

(10) Patent No.: US 9,007,144 B2
(45) Date of Patent: Apr. 14, 2015

(54) MULTILAYER POWER SPLITTER

(75) Inventor: Katsuyuki Kayahara, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 173 days.

(21) Appl. No.: 13/993,586

(22) PCT Filed: Oct. 19, 2011

(86) PCT No.: PCT/JP2011/073986
§ 371 (c)(1),
(2), (4) Date: Jul. 25, 2013

(87) PCT Pub. No.: WO2012/081307
PCT Pub. Date: Jun. 21, 2012

(65) Prior Publication Data
US 2014/0152398 A1    Jun. 5, 2014

(30) Foreign Application Priority Data

Dec. 13, 2010  (JP) .................................. 2010-277113
Jul. 29, 2011   (JP) .................................. 2011-166869

(51) Int. Cl.
*H03H 7/38*   (2006.01)
*H03H 7/46*   (2006.01)
*H01F 19/04*  (2006.01)
*H01F 27/28*  (2006.01)
*H03H 7/48*   (2006.01)

(52) U.S. Cl.
CPC ................. *H03H 7/46* (2013.01); *H01F 19/04* (2013.01); *H01F 27/2804* (2013.01); *H01F 2027/2819* (2013.01); *H03H 7/48* (2013.01)

(58) Field of Classification Search
CPC ......... H03H 7/48; H03H 7/482; H03H 7/485; H03H 7/487; H04B 1/581; H01F 19/04; H01F 21/00

USPC .................................................. 333/131, 119
See application file for complete search history.

(56) References Cited

U.S. PATENT DOCUMENTS

| | | | | |
|---|---|---|---|---|
| 3,454,905 A | * | 7/1969 | Winegard | 333/131 |
| 7,755,452 B2 | * | 7/2010 | Knickerbocker et al. | 333/131 |
| 8,471,648 B2 | * | 6/2013 | Rijssemus | 333/131 |

FOREIGN PATENT DOCUMENTS

| | | |
|---|---|---|
| JP | S44-024885 Y1 | 10/1969 |
| JP | H09-307395 A  | 11/1997 |
| JP | H10-304530 A  | 11/1998 |
| JP | 2010-040882 A | 2/2010 |
| JP | 2010-118367 A | 5/2010 |

OTHER PUBLICATIONS

International Search Report mailed Jan. 24, 2012, issued for International application No. PCT/JP2011/073986.

* cited by examiner

*Primary Examiner* — Robert Pascal
*Assistant Examiner* — Kimberly Glenn
(74) *Attorney, Agent, or Firm* — Law Office of Katsuhiro Arai

(57) ABSTRACT

A multilayer power splitter includes a laminate contains two transformers, wherein the inductance ratio of the primary side and secondary side of the first transformer is adjusted to 4:1, whereas the inductance ratio of the primary side and secondary side of the second transformer is adjusted to 1:1. An input port is branched into two for inputting to the primary side and secondary side of the first transformer in opposite phases, with one output made from the first output port. The other output from the first transformer is branched into two for inputting to the primary side and secondary side of the second transformer in opposite phases, with one output made from the second output port and the other output made from the third output port.

16 Claims, 7 Drawing Sheets

MULTILAYER POWER SPLITTER

This application is the U.S. National Phase under 35 U.S.C. §371 of International Application PCT/JP2011/073986, filed Oct. 19, 2011, which claims priority to Japanese Patent Application No. 2010-277113, filed Dec. 13, 2010, and No. 2011-166869, filed Jul. 29, 2011. The International Application was published under PCT Article 21(2) in a language other than English.

TECHNICAL FIELD

The present invention relates to an electronic component that allows for multiple-way splitting of high-frequency power using one component.

BACKGROUND ART

Traditionally known high-frequency power split circuits include the one described in Patent Literature 1, for example. The split circuit described in Patent Literature 1 is a two-way split circuit that uses a common-mode choke coil. This common-mode choke coil has a laminate structure, constituted by stacking together an insulator layer on which a first coil conductor has been formed and an insulator layer on which a second coil conductor has been formed, with this laminate further sandwiched by a pair of magnetic boards.

BACKGROUND ART LITERATURE

Patent Literature

Patent Literature 1: Japanese Patent Laid-open No. 2010-118367

SUMMARY OF THE INVENTION

Problems to Be Solved by the Invention

However, the split circuit described in Patent Literature 1 has a split number of 2, and in order to increase the split number to 3, multiple common-mode choke coils, resistors, etc., must be combined, which gives rise to the problem of larger mounting area.

The present invention was developed in light of the aforementioned situation and an object of the present invention is to provide an electronic component that has a simple structure, can be reduced in size with ease, and allows for three-way splitting of high-frequency power.

Means for Solving the Problems

To achieve the aforementioned object, the invention under the present application for patent provides a multilayer power splitter comprising a laminate constituted by multiple insulator layers stacked together, as well as one input port and three output ports formed on the exterior surface of the laminate, wherein such multilayer power splitter is characterized in that: the laminate contains a first transformer and second transformer; the first transformer and second transformer are formed in such a way that their primary coils and secondary coils overlap with each other, respectively, in different layers of the laminate and also sandwich an insulator layer in between; the input port is branched into two, and one branch is connected to one end of the primary coil of the first transformer, with the other branch connected to one end of the secondary coil of the first transformer in a phase opposite to the one on the primary side; the other end of the primary coil of the first transformer is connected to the first output port; the other end of the secondary coil of the first transformer is branched into two, and one branch is connected to one end of the primary coil of the second transformer, with the other branch connected to one end of the secondary coil of the second transformer in a phase opposite to the one on the primary side; the other end of the primary coil of the second transformer is connected to the second output port; and the other end of the secondary side of the second transformer is connected to the third output port. The invention under the present application for patent is further characterized in that the inductance ratio of the primary coil and secondary coil of the first transformer is 4:1, while the inductance ratio of the primary coil and secondary coil of the second transformer is 1:1.

Under the present invention, high-frequency power that has been input from the input port is input to one end of the primary side of the first transformer and one end of the secondary side of the same in such a way that the two inputs have opposite phases. Here, since the inductance ratio of the primary coil and secondary coil of the first transformer is 4:1, one-third the input power is output from the other end of the primary side of the first transformer; i.e., from the first output port. On the other hand, two-thirds the input power is output from the other end of the secondary coil of the first transformer. Then, the high-frequency power that has been output from the other end of the secondary coil of the first transformer is input to one end of the primary side of the second transformer and one end of the secondary side of the same in such a way that the inputs have opposite phases. Here, since the inductance ratio of the primary coil and secondary coil of the second transformer is 1:1, one-half the input power to the second transformer, or specifically one-third the input power to the input port, is output from the other end of the primary side of the second transformer, i.e., from the second output port. Similarly, one-half the input power to the second transformer, or specifically one-third the input power to the input port, is output from the other end of the secondary coil of the second transformer, i.e., from the third output port. According to the present invention, three-way splitting of high-frequency power is possible based on a simple structure as described above using one component. This leads to greater convenience such as easier installation, while also allowing for size reduction.

To determine the aforementioned inductance ratios, the inner-side area and number of windings of each coil can be controlled. Accordingly, one favorable embodiment of the present invention is characterized in that, for example, the inner-side area of the primary coil of the first transformer and inner-side area of the secondary coil of the same have an area ratio of 4:1, while the inner-side area of the primary coil of the second transformer and inner-side area of the secondary coil of the same have an area ratio of 1:1. Another example is characterized in that the ratio of the numbers of windings of the primary coil and secondary coil of the first transformer is 2:1, while the ratio of the numbers of windings of the primary coil and secondary coil of the second transformer is 1:1.

It should be noted that, while the inductance ratio of the primary coil and secondary coil of the first transformer is 4:1 in the foregoing, it only suffices that the output signal is divided into three at a specified tolerance (such as ±10%), including a situation where the inductance ratio is effectively 4:1 within the scope of design items and margin of error in consideration of the reality of mounting such as the wiring lengths of internal conductors, the via pads, and so on. The same level of strictness applies to the inductance ratio of the primary coil and secondary coil of the second transformer. In addition, the level of strictness that applies to the aforementioned area ratio of the inner-side areas of the coils is the same as the level of strictness of the inductance ratio as mentioned above.

It should also be noted that, although the ratio of the numbers of windings of the primary coil and secondary coil of the first transformer is 2:1 in the foregoing, this includes a situation where the ratio is effectively 2:1 within the scope of design items and margin of error in consideration of the reality of mounting such as the wiring lengths of internal conductors, and so on. For example, a situation where the ratio is not precisely 2:1 due to the wiring of coil conductors, or specifically when the ratio is 2.1:1 or 1.9:1, is also included in the invention under the present application for patent. Furthermore, each coil conductor may have a number of windings which is an integer plus one-half, such as 2.5, due to its wiring, and therefore ratios of 2.5:1.5=1.67:1 and 3.5:1.5=2.33:1 are also possible and included in the scope of the invention under the present application for patent in light of the purpose of the invention under the present application for patent. This is because the part of the coil conductor corresponding to the additional one-half turn serves only for wiring purposes and is considered different from the coil conductor per se; i.e., it is considered a connection conductor. The same level of strictness applies to the ratio of the numbers of windings of the primary coil and secondary coil of the second transformer.

One favorable embodiment of the present invention is characterized in that, for example, the input port is formed in a manner extending in the laminating direction on the side face of the laminate, where one end of the primary coil of the first transformer is connected to the input port via a connection conductor formed on the same layer as the primary coil, while one end of the secondary coil of the first transformer is connected to the input port via a connection conductor formed on the same layer as the secondary coil. This way, the input port also functions to branch the input power, which makes the laminate structure simple and manufacturing thereof easy.

Another proposal is characterized in that, in this structure, an inter-layer connection terminal is formed in a manner extending in the laminating direction on the side face of the laminate, where the other end of the secondary coil of the first transformer is connected to the inter-layer connection terminal via a connection conductor formed on the same layer as the secondary coil, one end of the primary coil of the second transformer is connected to the inter-layer connection terminal via a connection conductor formed on the same layer as the primary coil, and one end of the secondary coil of the second transformer is connected to the inter-layer connection terminal via a connection conductor formed on the same layer as the secondary coil. This structure, which allows the inter-layer connection terminal to branch from the first transformer to the second transformer, makes the laminate simple and manufacturing thereof easy.

In other words, such multilayer power splitter has the structure described below. To be specific, the invention under the present application for patent comprises: a laminate of roughly rectangular solid shape constituted by multiple insulator layers stacked together; internal conductors embedded in the laminate; an input port formed on the side face of the laminate and electrically connected to the internal conductors; an inter-layer connection terminal formed on the side face of the laminate and used to electrically interconnect the internal conductors formed on different insulator layers; and first through third output ports formed on the side face of the laminate and electrically connected to the internal conductors.

In addition, the internal conductors include: a first spiral coil conductor; a second spiral coil conductor positioned in a manner facing the first coil conductor via an insulator layer; a third spiral conductor positioned where it does not overlap with the first coil conductor in the laminating direction; a fourth spiral conductor positioned in a manner facing the third coil conductor via an insulator layer; a first connection conductor that electrically connects the input port to one end of the first coil conductor; a second connection conductor that electrically connects the first output port and the other end of the first coil conductor; a third connection conductor that electrically connects the input port and one end of the second coil conductor; a fourth connection conductor that electrically connects the inter-layer connection terminal and the other end of the second coil conductor; a fifth connection conductor that electrically connects the inter-layer connection terminal and one end of the third coil conductor; a sixth connection conductor that electrically connects the second output port and the other end of the third coil conductor; a seventh connection conductor that electrically connects the connection port and one end of the fourth coil conductor; and an eighth connection conductor that electrically connects the third output port and the other end of the fourth coil conductor. Furthermore, the first coil conductor and second coil conductor are positioned in such a way that current flows in opposite directions, while the third coil conductor and fourth coil conductor are positioned in such a way that current flows in opposite directions. Also, the inductance ratio of the first coil conductor and second coil conductor is 4:1, while the inductance ratio of the third coil conductor and fourth coil conductor is 1:1.

Additionally, one favorable embodiment of the present invention is characterized in that, for example, the laminate comprises at least a partial laminate made by stacking together multiple insulator layers on which internal conductors have been formed to form the transformers, as well as a pair of magnetic layers stacked in a manner sandwiching the partial laminate. Another embodiment is characterized in that magnetic material is filled on the inner side of the coils of each transformer in the partial laminate.

Effects of the Present Invention

As explained above, high-frequency power that has been input to the input port is divided and output to each output port by one-third, respectively. This means that, according to the present invention, three-way splitting of high-frequency power is possible based on a simple structure using one component. This leads to greater convenience such as easier installation, while also allowing for size reduction.

MODES FOR CARRYING OUT THE INVENTION

First Embodiment

The multilayer power splitter pertaining to the first embodiment of the present invention is explained by referring to drawings.

Figure 1:
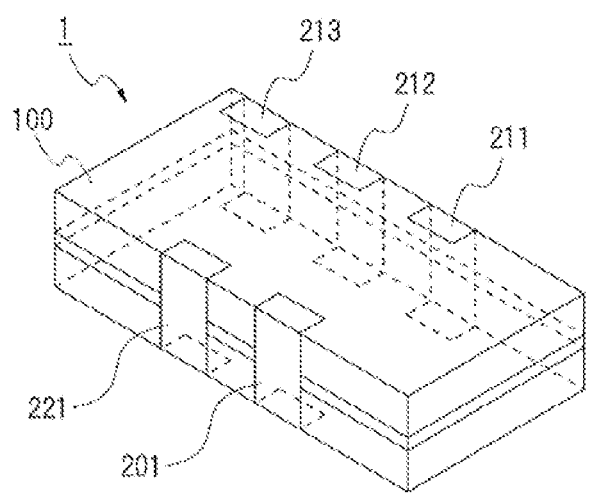
FIG. 1 Exterior perspective view of a multilayer power splitter
Figure 2:
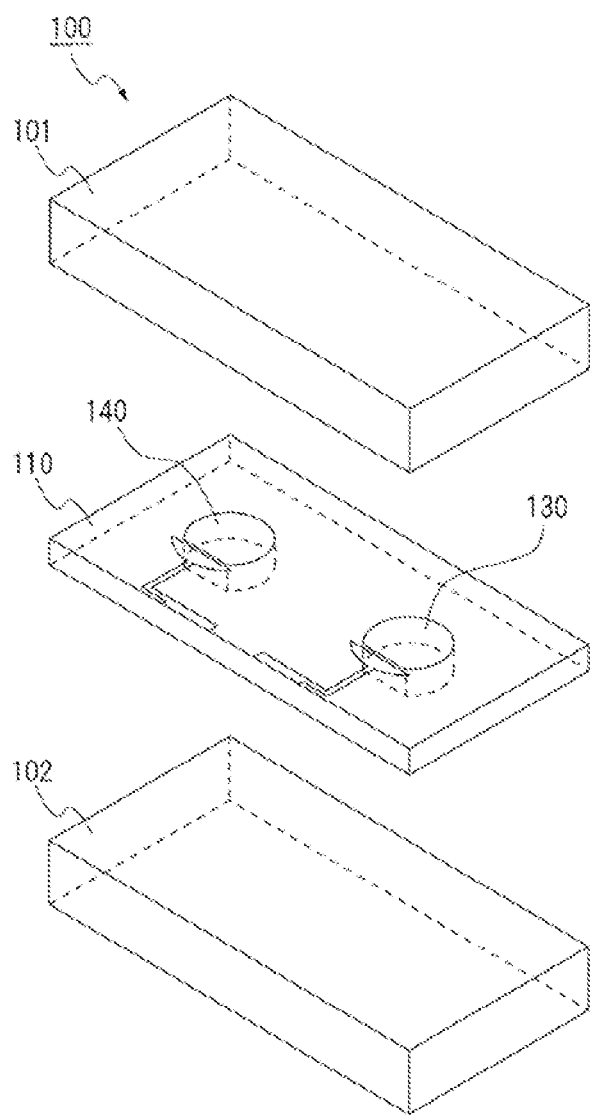
FIG. 2 Exploded perspective view explaining the structure of the laminate
Figure 3:
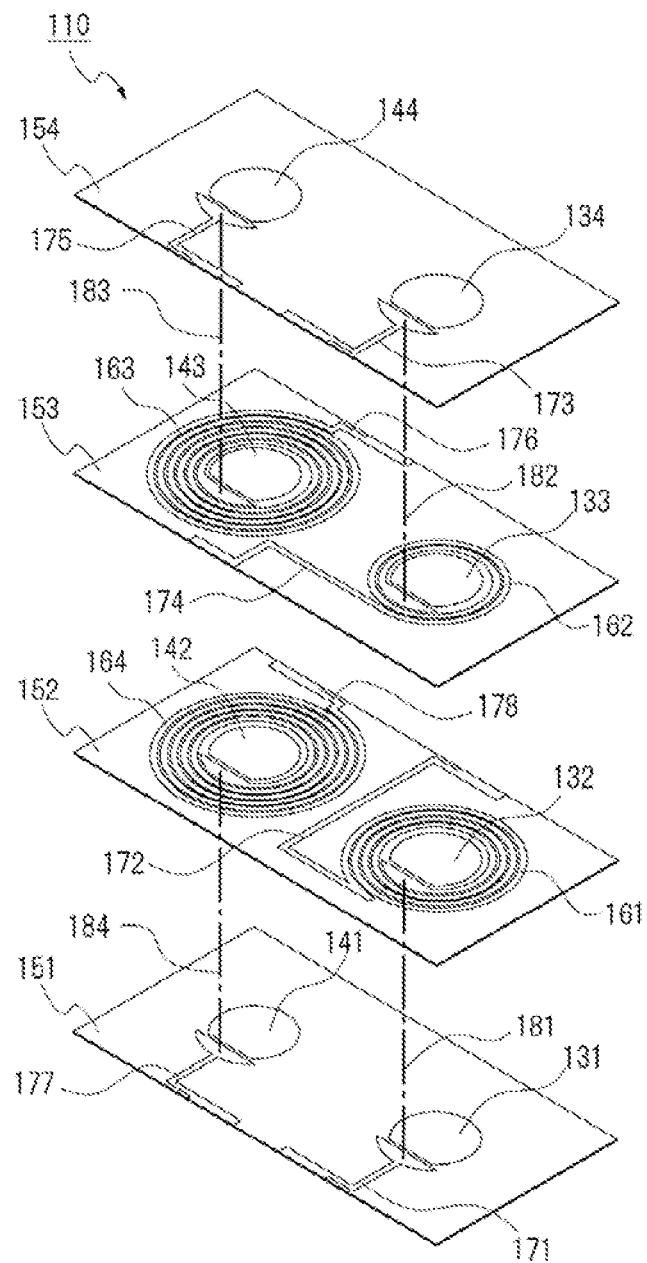
FIG. 3 Exploded perspective view explaining the structure of the partial laminate pertaining to the first embodiment FIG. 4 Equivalent circuit diagram of a multilayer power splitter FIG. 5 Exploded perspective view explaining the structure of the partial laminate pertaining to the second embodiment FIG. 6 Exploded perspective view explaining the structure of the partial laminate pertaining to the third embodiment FIG. 7 Exploded perspective view explaining the structure of the partial laminate pertaining to the fourth embodiment

FIG. 1 is an exterior perspective view of the multilayer power splitter, FIG. 2 is an exploded perspective view of the laminate constituting the laminated splitter, and FIG. 3 is an exploded perspective view of the partial laminate constituting the laminate.

As shown in FIG. 1, a multilayer power splitter 1 has a laminate 100 of roughly rectangular solid shape, one input port 201, first through third output ports 211, 212, 213, and one inter-layer connection terminal 221 formed on the exterior surface of the laminate 100. The laminate 100 is constituted by insulators stacked together in the vertical direction in FIG. 1. The laminate 100 has a rectangular shape in top view or bottom view, where the ratio of the long side and short side is approx. 2:1.

The input port 201, output ports 211 to 213, and inter-layer connection terminal 221 are formed on the side faces of the laminate 100, or specifically the surface on which the cross-sections of the insulators constituting the laminate 100 are exposed, each in a manner extending in the laminating direction by maintaining a specified width, with its ends reaching the top face and bottom face of the laminate 100. The input port 201 is formed roughly at the center of an end face of the laminate 100 in the longitudinal direction. The inter-layer connection terminal 221 is formed on the same side face as the one where the input port 201 is. The output ports 211 to 213 are formed roughly at an equal pitch on the end face in the longitudinal direction opposite the one where the input port 201 is.

As shown in FIG. 2, the laminate 100 is made by laminating together a pair of magnetic materials 101, 102 and a partial laminate 110 sandwiched by the magnetic materials 101, 102. The magnetic materials 101, 102 may be ferrite sintered compacts, for example. Formed at the center of the partial laminate 110 are two magnetic parts 130, 140 arranged side by side in the longitudinal direction and extending in roughly a columnar shape in the laminating direction. As explained later, these magnetic parts 130, 140 correspond to the magnetic cores of the transformers.

As shown in FIG. 3, the partial laminate 110 is made by stacking together first through fourth insulator layers 151, 152, 153, 154, which are non-magnetic materials, in this order. In this embodiment, a glass ceramic of relatively low dielectric constant was used for the insulator layers 151 to 154. The partial laminate 110 contains two transformers. Formed on the insulator layers 151 to 154, as internal conductors, are coil conductors forming each transformer as well as wirings for connecting each coil conductor and each port or terminal. The structure of the partial laminate 110 is explained in detail below.

A first coil conductor 161 is formed on the second insulator layer 152. A magnetic layer 132 constituting a part of the magnetic part 130 is formed on the inner side of the first coil conductor 161. A second coil conductor 162 is formed on the third insulator layer 153. A magnetic layer 133 constituting a part of the magnetic part 130 is formed on the inner side of the second coil conductor 162. The first coil conductor 161 and second coil conductor 162 are formed in a manner wound around the magnetic part 130 as a magnetic core, and positioned in a manner facing each other via the third insulator layer 153, i.e., overlapping with each other by sandwiching the third insulator layer 153 in between. As a result, the first coil conductor 161 and second coil conductor 162 constitute a first transformer. Here, it should be noted that the first coil conductor 161 and second coil conductor 162 are wound in opposite directions and that the ratio of the numbers of windings of the two is adjusted to 2:1 in order to achieve an inductance ratio of 4:1 between the first coil conductor 161 and second coil conductor 162.

The end of the first coil conductor 161 on its center side is formed to have wide width. Formed on the first insulator layer 151 is a first connection conductor 171 extending from the input port 201 to a position overlapping with the end of the first coil conductor 161 on the center side. The end of the first connection conductor 171 is connected to the end of the first coil conductor 161 on the center side by a via hole 181. Formed on the first insulator layer 151 is a magnetic layer 131 constituting a part of the magnetic part 130. Formed on the second insulator layer 152 is a second connection conductor 172 connecting the end of the first coil conductor 161 on the outer side and the first output port 211.

The end of the second coil conductor 162 on the center side is formed wide. Formed on the fourth insulator layer 154 is a third connection conductor 173 extending from the input port 201 to a position overlapping with the end of the second coil conductor 162 on the center side. The end of the third connection conductor 173 is connected to the end of the second coil conductor 162 on the center side by a via hole 182. Formed on the fourth insulator layer 154 is a magnetic layer 134 constituting a part of the magnetic part 130. Formed on the third insulator layer 153 is a fourth connection conductor 174 connecting the end of the second coil conductor 162 on the outer side and the inter-layer connection terminal 221.

Formed on the third insulator layer 153 lateral to the second coil conductor 162 in the longitudinal direction is a third coil conductor 163. Formed on the inner side of the third coil conductor 163 is a magnetic layer 143 constituting a part of the magnetic part 140. Formed on the second insulator layer 152 is a fourth coil conductor 164. Formed on the inner side of the fourth coil conductor 164 is a magnetic layer 142 constituting a part of the magnetic part 140. The third coil conductor 163 and fourth coil conductor 164 are formed in a manner wound around the magnetic part 140 as a magnetic core, and positioned in a manner facing each other via the third insulator layer 153, i.e., overlapping with each other by sandwiching the third insulator layer 153 in between. As a result, the third coil conductor 163 and fourth coil conductor 164 constitute a second transformer. Here, it should be noted that the third coil conductor 163 and fourth coil conductor 164 are wound in opposite directions and that the ratio of the numbers of windings of the two is adjusted to 1:1 in order to achieve an inductance ratio of 1:1 between the third coil conductor 163 and fourth coil conductor 164.

The end of the third coil conductor 163 on the center side is formed wide. Formed on the fourth insulator layer 154 is a fifth connection conductor 175 extending from the inter-layer connection terminal 221 to a position overlapping with the end of the third coil conductor 163 on the center side. The end of the fifth connection conductor 175 is connected to the end of the third coil conductor 163 on the center side by a via hole 183. Formed on the fourth insulator layer 154 is a magnetic layer 144 constituting a part of the magnetic part 140. Formed on the third insulator layer 153 is a sixth connection conductor 176 connecting the end of the third coil conductor 163 on the outer side and the second output port 212.

The end of the fourth coil conductor 164 on the center side is formed wide. Formed on the first insulator layer 151 is a seventh connection conductor 177 extending from the inter-layer connection terminal 221 to a position overlapping with the end of the fourth coil conductor 164 on the center side. The end of the seventh connection conductor 177 is connected to the end of the fourth coil conductor 164 on the center side by a via hole 184. Formed on the first insulator layer 151 is a magnetic layer 141 constituting a part of the magnetic part 140. Formed on the second insulator layer 152 is an eighth connection conductor 178 connecting the end of the fourth coil conductor 164 on the outer side and the third output port 213.

Figure 4:
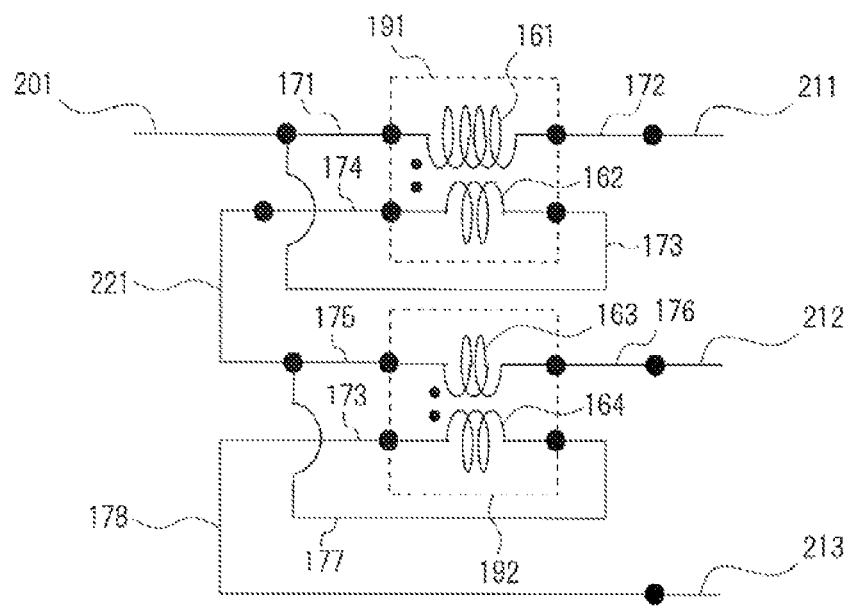

An equivalent circuit of the multilayer power splitter 1 pertaining to this embodiment is shown in FIG. 4. As shown in FIG. 4, the multilayer power splitter 1 contains the first transformer 191 and second transformer 192. Additionally, the input port 201 also functions to branch the input power into two. One branched input power is input to one end of the first coil conductor 161 being the primary coil of the first transformer 191, while the other branched input power is input to one end of the second coil conductor 162 being the secondary coil of the first transformer 191. Here, the ratio of the numbers of windings of the first coil conductor 161 and second coil conductor 162 is 2:1, which means that the inductance ratio of the two is 4:1. Furthermore, the first coil conductor 161 and second coil conductor 162 are wound in opposite directions and also formed in such a way that power is input from the center side of the coil. This means that the first coil conductor 161 and second coil conductor 162 have a negative coupling coefficient. In other words, the current flowing through the first coil conductor 161 and current flowing through the second coil conductor 162 have opposite phases, meaning that they flow in opposite directions. A preferable coupling efficient is one close to −1. Based on this structure, the output power from the other end of the first coil conductor 161 and output power from the other end of the second coil conductor 162 have an amplitude ratio of 1:2. As a result, power of an amplitude corresponding to one-third the input power is output from the first output port 211. On the other hand, power of an amplitude corresponding to two-thirds the input power is output from the other end of the second coil conductor 162.

The other end of the second coil conductor 162 of the first transformer 191 is connected to the inter-layer connection terminal 221. This inter-layer connection terminal 221 has a function to branch the output power of the second coil conductor 162 into two. One branch of power is input to one end of the third coil conductor 163 being the primary coil of the second transformer 192, while the other branch of power is input to one end of the fourth coil conductor 164 being the secondary coil of the second transformer 192. Here, the ratio of the numbers of windings of the third coil conductor 163 and fourth coil conductor 164 is 1:1, which means that the inductance ratio of the two is 1:1. Furthermore, the third coil conductor 163 and fourth coil conductor 164 are wound in opposite directions and also formed in such a way that power is input from the center side of the coil. This means that the third coil conductor 163 and fourth coil conductor 164 have a negative coupling coefficient. In other words, the current flowing through the third coil conductor 163 and current flowing through the fourth coil conductor 164 have opposite phases, meaning that they flow in opposite directions. A preferable coupling efficient is one close to −1. Based on this structure, the output power from the other end of the third coil conductor 163 and output power from the other end of the fourth coil conductor 164 have an amplitude ratio of 1:1. As a result, power of an amplitude corresponding to one-third the input power to the input port 201 is output from the second output port 212 and third output port 213.

Each output power relative to the input power was simulated for the multilayer power splitter 1 pertaining to this embodiment. Based on an input power of 1-GHz sinusoidal wave of 1.5 V in maximum voltage, the maximum voltages of output powers were 511.4 mV, 450.7 mV and 436.2 mV, respectively. The input losses and isolations were also good enough to withstand practical uses.

Next, the manufacturing method of the multilayer power splitter 1 pertaining to this embodiment is explained. First, insulator sheets made of a glass ceramic, etc., are prepared for forming insulator layers. Next, via holes are formed at specified positions of the insulator sheets, as necessary, using a laser, etc., while conductive paste is printed onto the insulator sheets to form internal conductors such as coil conductors and connection conductors (Step S1). Next, the insulator sheets are stacked together in a specified order and pressure-bonded to obtain a sheet laminate (Step S2). Next, through holes are formed using a laser, punch, etc., at positions corresponding to the magnetic cores of the transformers, and then magnetic paste is filled in the through holes (Step S3). Next, cover sheets (not illustrated in FIGS. 2 and 3) are stacked on the top and bottom of the sheet laminate, after which the sheet laminate is sintered at a specified temperature in a specified ambience. Next, the sheet laminate is cut to the unit component size to obtain a partial laminate 110 (Step S4). Next, magnetic materials 101, 102 are bonded with adhesive on the top and bottom of the partial laminate 110 to obtain a laminate 100 (Step S5). Next, conductive paste is applied onto the side faces of the laminate 100, after which an input port 201, output ports 211 to 213 and inter-layer connection terminal 221 are formed to obtain a multilayer power splitter 1 (Step S6).

According to the multilayer power splitter 1 pertaining to this embodiment, three-way splitting of high-frequency power is possible based on a simple structure using one electronic component, as described above. This leads to greater convenience such as easier installation, while also allowing for size reduction.

Second Embodiment

The multilayer power splitter pertaining to the second embodiment of the present invention is explained by referring to a drawing. The multilayer power splitter pertaining to this embodiment is different from the first embodiment in the laminate structure of the partial laminate. Since the remainder of the structure is the same as that of the first embodiment, only the differences are explained in detail here.

Figure 5:
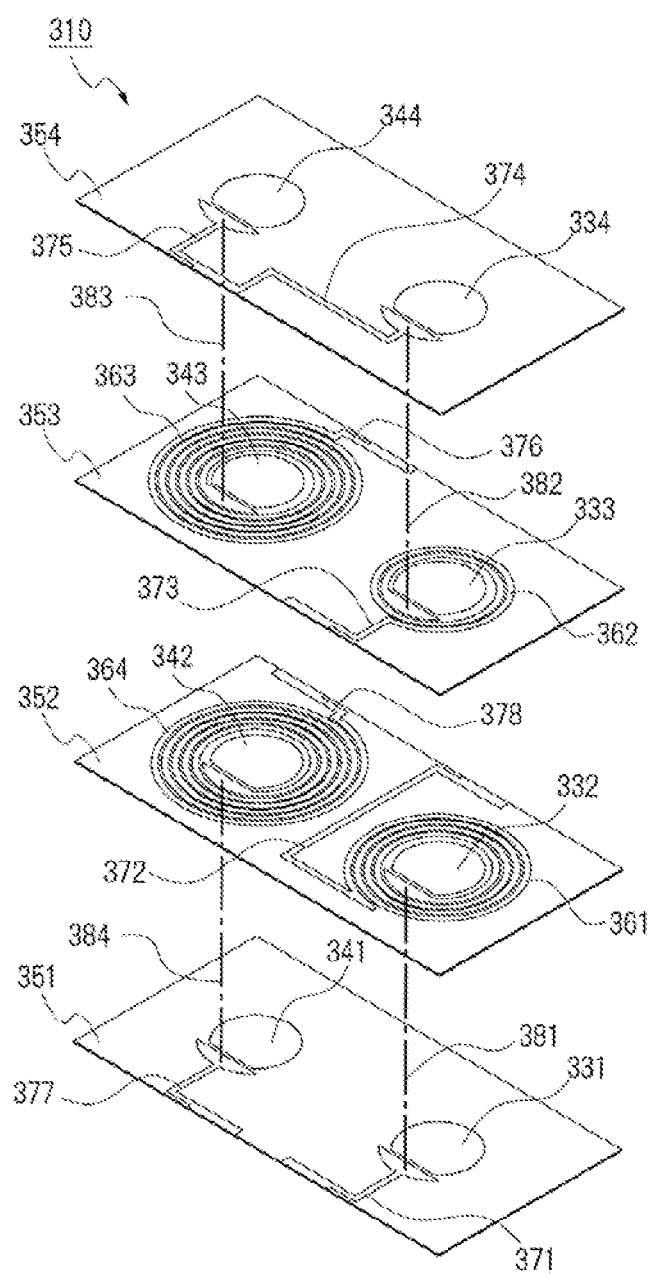

In the first embodiment mentioned above, the first coil conductor 161 and second coil conductor 162 constituting the first transformer 191 were wound in opposite directions and current was made to flow from the inner side to the outer side so as to achieve a negative coupling coefficient between the two. In this embodiment, on the other hand, the first coil conductor and second coil conductor are wound in the same direction, while current is made to flow from the inner side to the outer side in one, and from the outer side to the inner side in the other. The second transformer 192 is the same as in the first embodiment. The structure of a partial laminate 310 is explained in detail below using FIG. 5.

Formed on a second insulator layer 352 is a first coil conductor 361. Formed on the inner side of the first coil conductor 361 is a magnetic layer 332 constituting a part of the magnetic part 130. Formed on a third insulator layer 353 is a second coil conductor 362. Formed on the inner side of the second coil conductor 362 is a magnetic layer 333 constituting a part of the magnetic part 130. The first coil conductor 361 and second coil conductor 362 are formed in a manner wound around the magnetic part 130 as a magnetic core, and positioned in a manner facing each other via the third insulator layer 353; i.e., overlapping with each other by sandwiching the third insulator layer 353 in between. As a result, the first coil conductor 361 and second coil conductor 362 constitute a first transformer. Here, it should be noted that the first coil conductor 361 and second coil conductor 362 are wound in the same direction and that the ratio of the numbers of windings of the first coil conductor 361 and second coil conductor 362 is adjusted to 2:1.

The end of the first coil conductor 361 on the center side is formed wide. Formed on a first insulator layer 351 is a first connection conductor 371 extending from the input port 201 to a position overlapping with the end of the first coil conductor 361 on the center side. The end of the first connection conductor 371 is connected to the end of the first coil conductor 361 on the center side by a via hole 381. Formed on the first insulator layer 351 is a magnetic layer 331 constituting a part of the magnetic part 130. Formed on the second insulator layer 352 is a second connection conductor 372 connecting the end of the first coil conductor 361 on the outer side and the first output port 211.

The end of the second coil conductor 362 on the center side is formed wide. Formed on the third insulator layer 353 is a third connection conductor 373 connecting the end of the second coil conductor 362 on the outer side and the input port 201. Formed on a fourth insulator layer 354 is a fourth connection conductor 374 extending from the inter-layer connection terminal 221 to a position overlapping with the end of the second coil conductor 362 on the center side. The end of the fourth connection conductor 374 is connected to the end of the second coil conductor 362 on the center side by a via hole 382. Formed on the fourth insulator layer 354 is a magnetic layer 334 constituting a part of the magnetic part 130.

Formed on the third insulator layer 353 lateral to the second coil conductor 362 in the longitudinal direction is a third coil conductor 363. Formed on the inner side of the third coil conductor 363 is a magnetic layer 343 constituting a part of the magnetic part 140. Formed on the second insulator layer 352 is a fourth coil conductor 364. Formed on the inner side of the fourth coil conductor 364 is a magnetic layer 342 constituting a part of the magnetic part 140. The third coil conductor 363 and fourth coil conductor 364 are formed in a manner wound around the magnetic part 140 as a magnetic core, and positioned in a manner facing each other via the third insulator layer 353, i.e., overlapping with each other by sandwiching the third insulator layer 353 in between. As a result, the third coil conductor 363 and fourth coil conductor 364 constitute a second transformer. Here, it should be noted that the third coil conductor 363 and fourth coil conductor 364 are wound in opposite directions and that the ratio of the numbers of windings of the third coil conductor 363 and fourth coil conductor 364 is adjusted to 1:1.

The end of the third coil conductor 363 on the center side is formed wide. Formed on the fourth insulator layer 354 is a fifth connection conductor 375 extending from the inter-layer connection terminal 221 to a position overlapping with the end of the third coil conductor 363 on the center side. The end of the fifth connection conductor 375 is connected to the end of the third coil conductor 363 on the center side by a via hole 383. Formed on the fourth insulator layer 354 is a magnetic layer 344 constituting a part of the magnetic part 140. Formed on the third insulator layer 353 is a sixth connection conductor 376 connecting the end of the third coil conductor 363 on the outer side and the second output port 212.

The end of the fourth coil conductor 364 on the center side is formed wide. Formed on the first insulator layer 351 is a seventh connection conductor 377 extending from the inter-layer connection terminal 221 to a position overlapping with the end of the fourth coil conductor 364 on the center side. The end of the seventh connection conductor 377 is connected to the end of the fourth coil conductor 364 on the center side by a via hole 384. Formed on the first insulator layer 351 is a magnetic layer 341 constituting a part of the magnetic part 140. Formed on the second insulator layer 352 is an eighth connection conductor 378 connecting the end of the fourth coil conductor 364 on the outer side and the third output port 213.

According to the multilayer power splitter pertaining to this embodiment, three-way splitting of high-frequency power is possible based on a simple structure using one electronic component, just like in the first embodiment. This leads to greater convenience such as easier installation, while also allowing for size reduction. It should be noted that the equivalent circuit of the multilayer power splitter pertaining to this embodiment, as well as the simulation results and manufacturing method thereof, are the same as those of the first embodiment.

Third Embodiment

The multilayer power splitter pertaining to the third embodiment of the present invention is explained by referring to a drawing. The multilayer power splitter pertaining to this embodiment is different from the first embodiment in the laminate structure of the partial laminate. Since the remainder of the structure is the same as that of the first embodiment, only the differences are explained in detail here.

Figure 6:
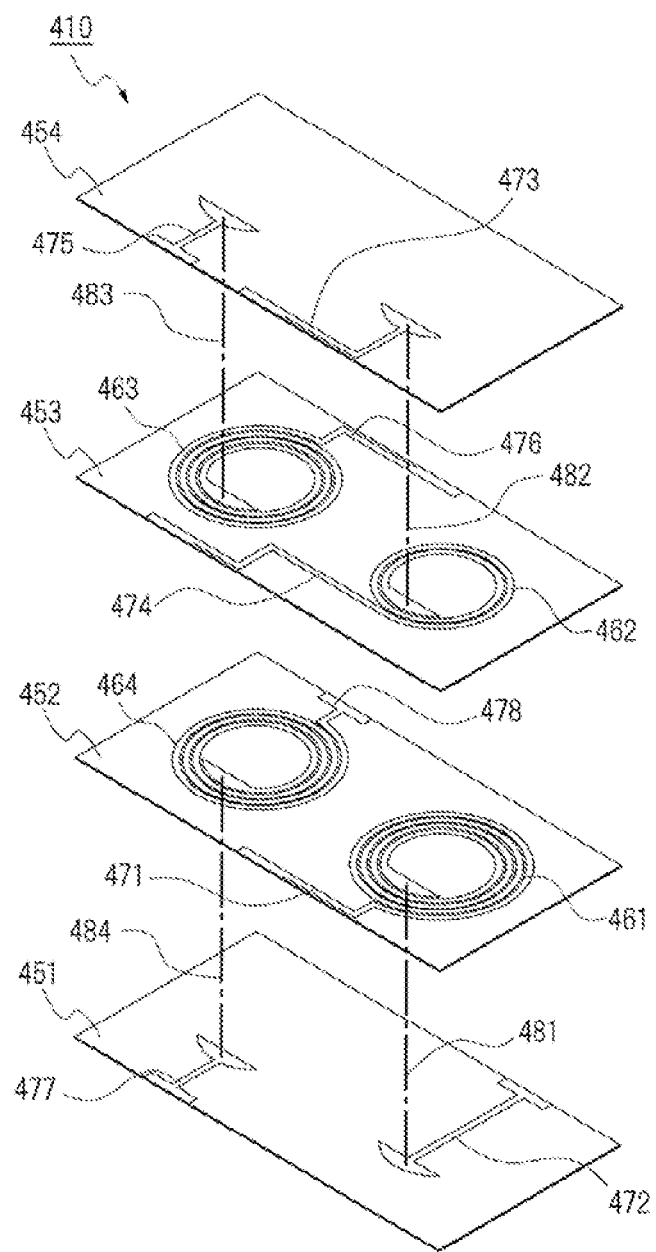

In the first embodiment mentioned above, the first coil conductor 161 and second coil conductor 162 constituting the first transformer 191 were wound in opposite directions and current was made to flow from the inner side to the outer side so as to achieve a negative coupling coefficient between the two. In this embodiment, on the other hand, the first coil conductor and second coil conductor are wound in the same direction, while current is made to flow from the inner side to the outer side in one, and from the outer side to the inner side in the other. The second transformer 192 is the same as in the first embodiment. This embodiment is also different from the first embodiment in that no magnetic part is formed in the partial laminate. The structure of a partial laminate 410 is explained in detail below using FIG. 6.

Formed on a second insulator layer 452 is a first coil conductor 461. Formed on a third insulator layer 453 is a second coil conductor 462. The first coil conductor 461 and second coil conductor 462 are formed in a manner wound around roughly an identical center axis, and positioned in a manner facing each other via the third insulator layer 453; i.e., overlapping with each other by sandwiching the third insulator layer 453 in between. As a result, the first coil conductor 461 and second coil conductor 462 constitute a first transformer. Here, it should be noted that the first coil conductor 461 and second coil conductor 462 are wound in the same direction and that the ratio of the numbers of windings of the first coil conductor 461 and second coil conductor 462 is adjusted to 2:1.

Formed on the second insulator layer 452 is a first connection conductor 471 connecting the end of the first coil conductor 461 on the outer side and the input port 201. The end of the first coil conductor 461 on the center side is formed wide. Formed on a first insulator layer 451 is a second connection conductor 472 extending from the first output port 211 to a position overlapping with the end of the first coil conductor 461 on the center side. The end of the second connection conductor 472 is connected to the end of the first coil conductor 461 on the center side by a via hole 481.

The end of the second coil conductor 462 on the center side is formed wide. Formed on the fourth insulator layer 454 is a third connection conductor 473 extending from the input port 201 to a position overlapping with the end of the second coil conductor 462 on the center side. The end of the third connection conductor 473 is connected to the end of the second coil conductor 462 on the center side by a via hole 482. Formed on the third insulator layer 453 is a fourth connection conductor 474 connecting the end of the second coil conductor 462 on the outer side and the inter-layer connection terminal 221.

Formed on the third insulator layer 453 lateral to the second coil conductor 462 in the longitudinal direction is a third coil conductor 463. Formed on the second insulator layer 452 is a fourth coil conductor 464. The third coil conductor 463 and fourth coil conductor 464 are formed in a manner wound around roughly an identical center axis, and positioned in a manner facing each other via the third insulator layer 453, i.e., overlapping with each other by sandwiching the third insulator layer 453 in between. As a result, the third coil conductor 463 and fourth coil conductor 464 constitute a second transformer. Here, it should be noted that the third coil conductor 463 and fourth coil conductor 464 are wound in opposite directions and that the ratio of the numbers of windings of the third coil conductor 463 and fourth coil conductor 464 is adjusted to 1:1.

The end of the third coil conductor 463 on the center side is formed wide. Formed on the fourth insulator layer 454 is a fifth connection conductor 475 extending from the inter-layer connection terminal 221 to a position overlapping with the end of the third coil conductor 463 on the center side. The end of the fifth connection conductor 475 is connected to the end of the third coil conductor 463 on the center side by a via hole 483. Formed on the third insulator layer 453 is a sixth connection conductor 476 connecting the end of the third coil conductor 463 on the outer side and the second output port 212.

The end of the fourth coil conductor 464 on the center side is formed wide. Formed on the first insulator layer 451 is a seventh connection conductor 477 extending from the inter-layer connection terminal 221 to a position overlapping with the end of the fourth coil conductor 464 on the center side. The end of the seventh connection conductor 477 is connected to the end of the fourth coil conductor 464 on the center side by a via hole 484. Formed on the second insulator layer 452 is an eighth connection conductor 478 connecting the end of the fourth coil conductor 464 on the outer side and the third output port 213.

According to the multilayer power splitter pertaining to this embodiment, three-way splitting of high-frequency power is possible based on a simple structure using one electronic component, just like in the first embodiment. This leads to greater convenience such as easier installation, while also allowing for size reduction. It should be noted that the equivalent circuit of the multilayer power splitter pertaining to this embodiment is the same as that of the first embodiment. The manufacturing method is also the same as that of the first embodiment, except that Step S3 is omitted, as well as the cover sheet stacking process in Step S4, if necessary.

The multilayer power splitter pertaining to this embodiment was also put through a simulation under the same conditions applied to the first embodiment. As a result, the maximum voltages of output powers were 485.1 mV, 464.9 mV and 456.9 mV, respectively, indicating that this multilayer power splitter was better than that of the first embodiment in terms of amplitude variation. Because the partial laminate had no magnetic part, however, it is assumed that the common-mode impedance could become low, leading to poor isolation.

Fourth Embodiment

The multilayer power splitter pertaining to the fourth embodiment of the present invention is explained by referring to a drawing. The multilayer power splitter pertaining to this embodiment is different from the third embodiment in the laminate structure of the partial laminate. Since the remainder of the structure is the same as that of the third embodiment, only the differences are explained in detail here.

Figure 7:
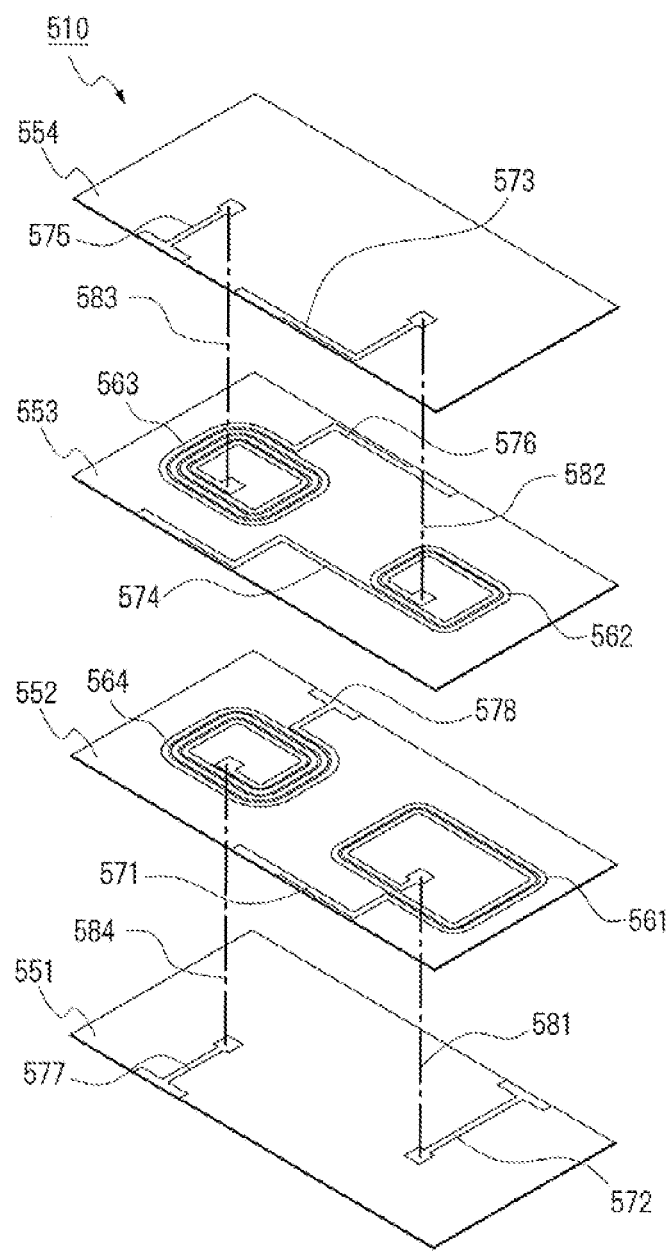

In each of the embodiments mentioned above, the inductance ratio of the first coil conductor 161, 361 or 461 and second coil conductor 162, 362 or 462, and that of the third coil conductor 163, 363, or 463 and fourth coil conductor 164, 364, or 464, were controlled by the ratios of the numbers of windings of the respective pairs of coil conductors, thereby controlling the split ratio of output powers. In this embodiment, on the other hand, the area ratio of the inner-side areas (core areas) of each pair of coils is controlled to control their inductance ratio, thereby controlling the split ratio of output powers. Split ratio control based on inner-side areas has an advantage in that it makes design and adjustment easier than split ratio control using the ratio of the numbers of windings. In addition, while the coils were formed as concentric circles in each of the embodiments mentioned above, they are formed as rectangles in this embodiment. Since components generally have a rectangular solid shape, rectangular coils allow for efficient use of space, which in turn helps reduce the component size. The structure of a partial laminate 510 is explained in detail below using FIG. 7.

Formed on a second insulator layer 552 is a first coil conductor 561. Formed on a third insulator layer 553 is a second coil conductor 562. The first coil conductor 561 and second coil conductor 562 are formed in a manner wound as rectangles around roughly an identical center axis, and positioned in a manner facing each other via the third insulator layer 553; i.e., overlapping with each other by sandwiching the third insulator layer 553 in between. As a result, the first coil conductor 561 and second coil conductor 562 constitute a first transformer. Here, it should be noted that the first coil conductor 561 and second coil conductor 562 are wound in the same direction and that the inductance ratio of the first coil conductor 561 and second coil conductor 562 is adjusted to 4:1. To achieve an inductance ratio of 4:1 between the first coil conductor 561 and second coil conductor 562, the area ratio of the inner-side area of the first coil conductor 561 and inner-side area of the second coil conductor 562 was adjusted to 4:1 in this embodiment. As a result, the second coil conductor 562 is formed at a position on the inner side of the first coil conductor 561. The number of windings of the first coil conductor 561 is the same as that of the second coil conductor 562.

Formed on the second insulator layer 552 is a first connection conductor 571 connecting the end of the first coil conductor 561 on the outer side and the input port 201. The end of the first coil conductor 561 on the center side is formed wide. Formed on a first insulator layer 551 is a second connection conductor 572 extending from the first output port 211 to a position overlapping with the end of the first coil conductor 561 on the center side. The end of the second connection conductor 572 is connected to the end of the first coil conductor 561 on the center side by a via hole 581.

The end of the second coil conductor 562 on the center side is formed wide. Formed on a fourth insulator layer 554 is a third connection conductor 573 extending from the input port 201 to a position overlapping with the end of the second coil conductor 562 on the center side. The end of the third connection conductor 573 is connected to the end of the second coil conductor 562 on the center side by a via hole 582. Formed on the third insulator layer 553 is a fourth connection conductor 574 connecting the end of the second coil conductor 562 on the outer side and the inter-layer connection terminal 221.

Formed on the third insulator layer 553 lateral to the second coil conductor 562 in the longitudinal direction is a third coil conductor 563. Formed on the second insulator layer 552 is a fourth coil conductor 564. The third coil conductor 563 and fourth coil conductor 564 are formed in a manner wound as rectangles around roughly an identical center axis, and positioned in a manner facing each other via the third insulator layer 553, i.e., overlapping with each other by sandwiching the third insulator layer 553 in between. As a result, the third coil conductor 563 and fourth coil conductor 564 constitute a second transformer. Here, it should be noted that the third coil conductor 563 and fourth coil conductor 564 are wound in opposite directions and that the inductance ratio of the third coil conductor 563 and fourth coil conductor 564 is adjusted to 1:1. To achieve an inductance ratio of 1:1 between the third coil conductor 563 and fourth coil conductor 564, the area ratio of the inner-side area of the third coil conductor 563 and inner-side area of the fourth coil conductor 564 was adjusted to 1:1 in this embodiment. Also, the number of windings of the third coil conductor 563 is the same as that of the fourth coil conductor 564. In other words, the third coil conductor 563 and fourth coil conductor 564 are each a laterally flipped version of the other.

The end of the third coil conductor 563 on the center side is formed wide. Formed on the fourth insulator layer 554 is a fifth connection conductor 575 extending from the inter-layer connection terminal 221 to a position overlapping with the end of the third coil conductor 563 on the center side. The end of the fifth connection conductor 575 is connected to the end of the third coil conductor 563 on the center side by a via hole 583. Formed on the third insulator layer 553 is a sixth connection conductor 576 connecting the end of the third coil conductor 563 on the outer side and the second output port 212.

The end of the fourth coil conductor 564 on the center side is formed wide. Formed on the first insulator layer 551 is a seventh connection conductor 577 extending from the inter-layer connection terminal 221 to a position overlapping with the end of the fourth coil conductor 564 on the center side. The end of the seventh connection conductor 577 is connected to the end of the fourth coil conductor 564 on the center side by a via hole 584. Formed on the second insulator layer 552 is an eighth connection conductor 578 connecting the end of the fourth coil conductor 564 on the outer side and the third output port 213.

According to the multilayer power splitter pertaining to this embodiment, three-way splitting of high-frequency power is possible based on a simple structure using one electronic component, just like in each of the embodiments mentioned above. This leads to greater convenience such as easier installation, while also allowing for size reduction. It should be noted that the equivalent circuit of the multilayer power splitter pertaining to this embodiment is the same as that of the first embodiment. The manufacturing method is also the same as that of the first embodiment, except that Step S3 is omitted, as well as the cover sheet stacking process in Step S4, if necessary. Furthermore, under this embodiment, the power split ratio of each transformer is controlled based on the inner-side area (i.e., coil diameter, core area and core diameter) of coil conductors, which makes it easy to adjust the split ratio accurately.

The multilayer power splitter pertaining to this embodiment was also put through a simulation under the same conditions applied to the first embodiment. As a result, the maximum voltages of output powers were 454 mV, 446 mV and 460 mV, respectively, indicating that this multilayer power splitter was better than that of the first embodiment in terms of amplitude variation. The input losses and isolations were also good enough to withstand practical uses.

The foregoing described the embodiments of the present invention in detail, but the present invention is not limited to these embodiments in any way. For example, whether or not to allow current to flow through each coil conductor from the inner side to the outer side, and accordingly whether to connect the coil conductor to each port or terminal in the same layer where the coil conductor is or in a different layer, can be designed as deemed appropriate to the extent that the following condition is met. To be specific, the condition is that a pair of coil conductors in each transformer has a negative coupling coefficient. In other words, the first insulator layer and second insulator layer may be swapped, and similarly the third insulator layer and fourth insulator layer may be swapped, in each embodiment.

Also, while the manufacturing methods in the embodiments above were such that insulator sheets were stacked together first, after which through holes were formed for magnetic parts and then filled with magnetic paste, the insulator sheets may be stacked together after through holes have been formed in each insulator sheet and filled with magnetic paste.

Also, while the magnetic parts 130, 140 were formed in the partial laminate 110 in a manner penetrating through the center of each coil conductor in the embodiments above, magnetic parts may be formed in the respective insulator layers on which internal conductors have been formed, instead of penetrating through the partial laminate 110. In this case, magnetic paste to form magnetic parts can be applied in the step before or after the printing of conductive paste to form internal conductors such as coil conductors and connection conductors.

Also, while input power was branched into two at the input port 201 in the embodiments mentioned above, via holes and connection conductors formed in the partial laminate 110 may be used for this purpose. Similarly, while the inter-layer connection terminal 221 formed on the side face of the laminate 100 was used for connecting and branching the first transformer 191 to/into the second transformer 192 in the embodiments mentioned above, via holes and connection conductors formed in the partial laminate 110 may be used for this purpose instead of the inter-layer connection terminal 221.

Also, while each coil was formed as a rectangle in the fourth embodiment mentioned above, each coil can also be formed as a rectangle in the first through third embodiments mentioned above. On the other hand, each coil may be formed as a concentric circle in the fourth embodiment.

DESCRIPTION OF THE SYMBOLS

1 - - - Multilayer power splitter, 100 - - - Laminate, 101, 102 - - - Magnetic material, 110 - - - Partial laminate, 130, 140, 330, 340 - - - Magnetic part, 151 to 154, 351 to 354, 451 to 454, 551 to 554 - - - Insulator layer, 161, 361, 461, 561 - - - First coil conductor, 162, 362, 462, 562 - - - Second coil conductor, 163, 363, 463, 563 - - - Third coil conductor, 164, 364, 464, 564 - - - Fourth coil conductor, 171 to 178, 371 to 378, 471 to 478, 571 to 578 - - - Connection conductor, 181 to 184, 381 to 384, 481 to 484, 581 to 584 - - - Via hole, 201 - - - Input port, 211 to 213 - - - Output port, 221 - - - Inter-layer connection terminal.

What is claimed is:

1. A multilayer power splitter comprising a laminate constituted by multiple insulator layers stacked together, as well as one input port and three output ports formed on an exterior surface of the laminate, wherein:
    the laminate contains a first transformer and a second transformer;
    the first transformer and second transformer are formed in such a way that their primary coils and secondary coils overlap with each other, respectively, in different layers of the laminate and also sandwich an insulator layer in between;
    the input port is branched into two, and one branch is connected to one end of the primary coil of the first transformer, with the other branch connected to one end of the secondary coil of the first transformer in a phase opposite to the one on the primary side;
    the other end of the primary coil of the first transformer is connected to the first output port;
    the other end of the secondary coil of the first transformer is branched into two, and one branch is connected to one end of the primary coil of the second transformer, with the other branch connected to one end of the secondary coil of the second transformer in a phase opposite to the one on the primary side;
    the other end of the primary coil of the second transformer is connected to the second output port;
    the other end of the secondary side of the second transformer is connected to the third output port; and
    an inductance ratio of the primary coil and secondary coil of the first transformer is 4:1, while an inductance ratio of the primary coil and secondary coil of the second transformer is 1:1.

2. A multilayer power splitter according to claim 1, wherein an area ratio of an inner-side area of the primary coil of the first transformer and inner-side area of the secondary coil of the same is 4:1, while an area ratio of an inner-side area of the primary coil of the second transformer and inner-side area of the secondary coil of the same is 1:1.

3. A multilayer power splitter according to claim 1, wherein a ratio of numbers of windings of the primary coil and secondary coil of the first transformer is 2:1, while a ratio of numbers of windings of the primary coil and secondary coil of the second transformer is 1:1.

4. A multilayer power splitter according to claim 1, wherein the input port is formed in a manner extending in a laminating direction on a side face of the laminate, where the one end of the primary coil of the first transformer is connected to the input port via a connection conductor formed on a same layer as the primary coil, while the one end of the secondary coil of the first transformer is connected to the input port via a connection conductor formed on a same layer as the secondary coil.

5. A multilayer power splitter according to claim 4, wherein an inter-layer connection terminal is formed in a manner extending in the laminating direction on the side face of the laminate, where the other end of the secondary coil of the first transformer is connected to the inter-layer connection terminal via a connection conductor formed on the same layer as the secondary coil, the one end of the primary coil of the second transformer is connected to the inter-layer connection terminal via a connection conductor formed on the same layer as the primary coil, and the one end of the secondary coil of the second transformer is connected to the inter-layer connection terminal via a connection conductor formed on the same layer as the secondary coil.

6. A multilayer power splitter according to claim 5, wherein the input port and inter-layer connection terminal are formed on a same side face of the laminate, and the first through third output ports are formed on a side face of the laminate opposite the one where the input port and inter-layer connection terminal are.

7. A multilayer power splitter according to claim 1, wherein the laminate comprises at least a partial laminate made by stacking together multiple insulator layers on which internal conductors have been formed to form the transformers, as well as a pair of magnetic layers stacked in a manner sandwiching the partial laminate.

8. A multilayer power splitter according to claim 7, wherein magnetic material is filled on an inner side of the coils of each transformer in the partial laminate.

9. A multilayer power splitter characterized by comprising: a laminate of roughly rectangular solid shape constituted by multiple insulator layers stacked together; internal conductors embedded in the laminate; an input port formed on a side face of the laminate and electrically connected to the internal conductors; an inter-layer connection terminal formed on a side face of the laminate and used to electrically interconnect the internal conductors formed on different insulator layers; and first through third output ports formed on a side face of the laminate and electrically connected to the internal conductors; wherein the internal conductors comprise:
    a first spiral coil conductor;
    a second spiral coil conductor positioned in a manner facing the first coil conductor via an insulator layer;
    a third spiral conductor positioned where it does not overlap with the first coil conductor in a laminating direction;
    a fourth spiral conductor positioned in a manner facing the third coil conductor via an insulator layer;
    a first connection conductor that electrically connects the input port to one end of the first coil conductor;
    a second connection conductor that electrically connects the first output port and the other end of the first coil conductor;
    a third connection conductor that electrically connects the input port and one end of the second coil conductor;
    a fourth connection conductor that electrically connects the inter-layer connection terminal and the other end of the second coil conductor;
    a fifth connection conductor that electrically connects the inter-layer connection terminal and one end of the third coil conductor;
    a sixth connection conductor that electrically connects the second output port and the other end of the third coil conductor;
    a seventh connection conductor that electrically connects the connection port and one end of the fourth coil conductor; and
    an eighth connection conductor that electrically connects the third output port and the other end of the fourth coil conductor;
    where the first coil conductor and second coil conductor are positioned in such a way that current flows in opposite directions;

the third coil conductor and fourth coil conductor are positioned in such a way that current flows in opposite directions;

an inductance ratio of the first coil conductor and second coil conductor is 4:1; and an inductance ratio of the third coil conductor and fourth coil conductor is 1:1.

10. A multilayer power splitter according to claim 9, wherein an area ratio of an inner-side area of the first coil conductor and inner-side area of the second coil conductor is 4:1, while an area ratio of an inner-side area of the third coil conductor and inner-side area of the fourth coil conductor is 1:1.

11. A multilayer power splitter according to claim 9, wherein a ratio of numbers of windings of the first coil conductor and second coil conductor (number of windings of the first coil conductor:number of windings of the second coil conductor) is 2:1, while a ratio of numbers of windings of the third coil conductor and fourth coil conductor (number of windings of the third coil conductor:number of windings of the fourth coil conductor) is 1:1.

12. A multilayer power splitter according to claim 9, wherein a magnetic material is positioned on an inner periphery of the first through fourth coil conductors.

13. A multilayer power splitter according to claim 2, wherein the input port is formed in a manner extending in a laminating direction on a side face of the laminate, where the one end of the primary coil of the first transformer is connected to the input port via a connection conductor formed on a same layer as the primary coil, while the one end of the secondary coil of the first transformer is connected to the input port via a connection conductor formed on a same layer as the secondary coil.

14. A multilayer power splitter according to claim 3, wherein the input port is formed in a manner extending in a laminating direction on a side face of the laminate, where the one end of the primary coil of the first transformer is connected to the input port via a connection conductor formed on a same layer as the primary coil, while the one end of the secondary coil of the first transformer is connected to the input port via a connection conductor formed on a same layer as the secondary coil.

15. A multilayer power splitter according to claim 10, wherein a magnetic material is positioned on an inner periphery of the first through fourth coil conductors.

16. A multilayer power splitter according to claim 11, wherein a magnetic material is positioned on an inner periphery of the first through fourth coil conductors.

* * * * *